United States Patent
Ail et al.

(10) Patent No.: US 10,902,532 B2
(45) Date of Patent: Jan. 26, 2021

(54) METHOD AND APPARATUS FOR CHARGING ENERGY CONSUMPTION

(71) Applicant: Samsung Electronics Co., Ltd., Suwon-si (KR)

(72) Inventors: Rohit Ail, Staines (GB); Timothy John Bailey, Staines (GB)

(73) Assignee: Samsung Electronics Co., Ltd., Suwon-si (KR)

( * ) Notice: Subject to any disclaimer, the term of this patent is extended or adjusted under 35 U.S.C. 154(b) by 22 days.

(21) Appl. No.: 15/661,700

(22) Filed: Jul. 27, 2017

(65) Prior Publication Data

US 2018/0165774 A1 Jun. 14, 2018

(30) Foreign Application Priority Data

Dec. 12, 2016 (GB) .................................. 1621102.1
Feb. 28, 2017 (KR) ........................ 10-2017-0026132

(51) Int. Cl.
| | |
|---|---|
| G06Q 50/06 | (2012.01) |
| G05B 19/048 | (2006.01) |
| G06Q 30/02 | (2012.01) |
| G01R 21/133 | (2006.01) |
| G05B 19/042 | (2006.01) |
| G01R 22/10 | (2006.01) |

(52) U.S. Cl.
CPC .......... *G06Q 50/06* (2013.01); *G01R 21/133* (2013.01); *G01R 22/10* (2013.01); *G05B 19/042* (2013.01); *G05B 19/048* (2013.01); *G06Q 30/02* (2013.01); *G06Q 30/0283* (2013.01); *G05B 2219/24015* (2013.01)

(58) Field of Classification Search
None
See application file for complete search history.

(56) References Cited

U.S. PATENT DOCUMENTS 5,572,438 A * 11/1996 Ehlers .................. G01R 21/133
307/37

OTHER PUBLICATIONS

Althaher et al., "Automated Demand Response From Home Energy Management System Under Dynamic Pricing and Power and Comfort Constraints", 2015 IEEE (Year: 2015).*
Jin et al., "Optimizing Electric Vehicle Charging With Energy Storage in the Electricity Market", IEEE 2013. (Year: 2013).*

* cited by examiner

*Primary Examiner* — Carlos R Ortiz Rodriguez
(74) *Attorney, Agent, or Firm* — Jefferson IP Law, LLP (57) ABSTRACT

A method for calculating a cost for energy consumption is provided. The method includes receiving information regarding an energy consuming device from the energy consuming device, and determining a first charging rate for energy consumed by the energy consuming device based on the received information regarding the energy consuming device.

15 Claims, 6 Drawing Sheets

METHOD AND APPARATUS FOR CHARGING ENERGY CONSUMPTION

CROSS-REFERENCE TO RELATED APPLICATION(S)

This application claims the benefit under 35 U.S.C. § 119(a) of a United Kingdom patent application filed on Dec. 12, 2016 in the United Kingdom Intellectual Property Office and assigned Serial number 1621102.1, and under 35 U.S.C. § 119(a) of a Korean patent application filed on Feb. 28, 2017 in the Korean Intellectual Property Office and assigned Serial number 10-2017-0026132, the entire disclosure of which is hereby incorporated by reference.

TECHNICAL FIELD

The present disclosure relates to an energy consumption device, and method and apparatus for estimating charges for energy consumption of the energy consumption device.

BACKGROUND

Businesses and residences consume energy such as electricity, gas, and water from utility facilities or from other sources. The consumed energy needs to be measured by the energy supplier so that the end user may be charged for the energy consumption. For this, a utility meter such as electricity, gas, or water meter is used to measure the consumption of energy by the business or residential premises. The following discussion will focus on the example of electrical energy, but the present disclosure may be equally applied to other energy sources such as gas and water.

The electrical energy network (the number of generation plants and the capacity of the grids) is sized to cope with the peak consumption. This means that power plants are constructed which may be used to meet peak demand for only a few hours a year such as between 4 pm and 7 pm on winter weekdays. Creating more flexibility in electricity demand may help flatten the demand out over the day and reduce the cost of investment in energy infrastructure. The inability of demand to adjust based on electricity supply availability and cost will have an increasing impact on required investment in infrastructure as more intermittent renewable energy sources come online, such as wind power, which are only available at certain times of day. Further, the increased electrification of technologies such as heating and cars means that the demand for energy consumption is higher than ever. Encouraging the efficient consumption of energy and rewarding the consumption of energy at times when it may be supplied cheaply is beneficial to the energy supplier, the consumer and the environment.

An existing system to reward the consumption of energy at certain times of the day is to use a variable rate meter which charges different rates for energy consumption based on the time of day. Consumption of energy at off-peak times will be charged at a discount tariff rate, encouraging use of energy for the consumer at the off-peak times. This existing system is, however, limited in that it does not isolate and charge for the energy consumption of individual energy consuming devices. In order to do so, it would be necessary to have a twin element meter, i.e., with two separate measuring elements—each being associated with a separate circuit. This would not be cost effective as it would require the installation of separate electrical circuits.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and apparatus for charging energy consumption, to encourage or discourage energy consumption at certain times or by certain types of devices, and to reduce installation costs.

In accordance with an aspect of the present disclosure, a method for calculating a cost for energy consumption is provided. The method includes receiving information regarding an energy consuming device from the energy consuming device, and determining a first charging rate for energy consumed by the energy consuming device based on the received information regarding the energy consuming device.

In accordance with another aspect of the present disclosure, an apparatus for calculating a cost for energy consumption is provided. The apparatus includes a communication interface, and a processor connected to the communication interface, wherein the processor is configured to receive information regarding an energy consuming device from the energy consuming device, and determine a first charging rate for energy consumed by the energy consuming device based on the received information regarding the energy consuming device.

In accordance with another aspect of the present disclosure, an apparatus for calculating a cost for energy consumption is provided. The apparatus includes an energy consuming device includes a communication interface configured to transmit information regarding the energy consuming device to an energy consumption cost calculator, wherein the energy consumption cost calculator is configured to determine a first charging rate for energy consumed by the energy consuming device based on the information regarding the energy consuming device.

Details of other embodiments are included in the description and accompanying drawings.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms "first", "second", etc., are herein used to describe many different components, but the components are not confined by the terms. Those terms are merely used to distinguish one component from another. For example, the first component herein used may also be the second component within the technical concept of the present disclosure.

Figure 1:
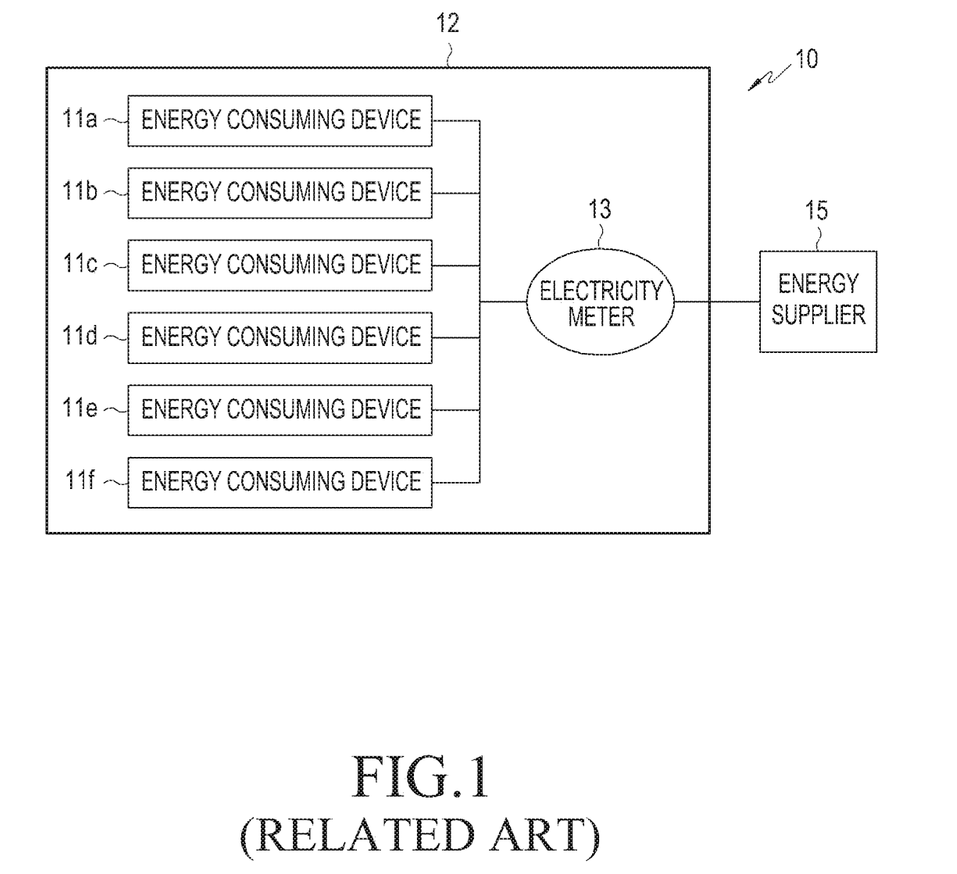
FIG. 1 is a schematic diagram of an energy system according to the related art.

FIG. 1 is a schematic diagram of a conventional energy system according to the related art.

Referring to FIG. 1, an energy system according to a related art arrangement and indicated generally by the reference numeral 10. The energy system 10 includes premises 12, which may be residential or commercial, with a number of energy consuming devices 11a, 11b, 11c, 11d, 11e, 11f. The energy consuming devices 11a-11f may be any kind of device which consumes electrical energy such as an appliance or an electric vehicle. The electrical energy consumed by the devices 11a-11f is measured by an electricity meter 13. The electricity meter 13 will typically be installed within or proximate to the premises 12. The electricity meter 13 shown in FIG. 1 is a smart electricity meter 13 which transmits the measured electrical energy information directly to an energy supplier 15 for the purposes of billing. Alternatively, the electricity meter 13 may not be a smart electricity meter 13 and the energy consumption has to be manually read from the electricity meter 13.

The electricity meter 13 is able to determine the energy consumption of the premises as a whole and is not able to determine the energy consumption of individual devices 11a-11f. Furthermore, the electricity meter 13 is unable to determine any information about the particular devices 11a-11f. Therefore, the bill for electrical energy consumed at the premises 12 is only determined based on the total energy consumed within the premises 12.

The electricity meter 13 could be a twin rate meter which charges a different rate for electricity used at different times of the day. The electricity meter 13 may also be a twin element meter 13, i.e., with two separate measuring elements—each associated with a separate circuit, which charge for electricity consumption at different rates. One of the devices 11a-11f could be connected to the electricity meter 13 in a separate circuit and charged a different rate to the other devices 11a-11f.

Figure 2:
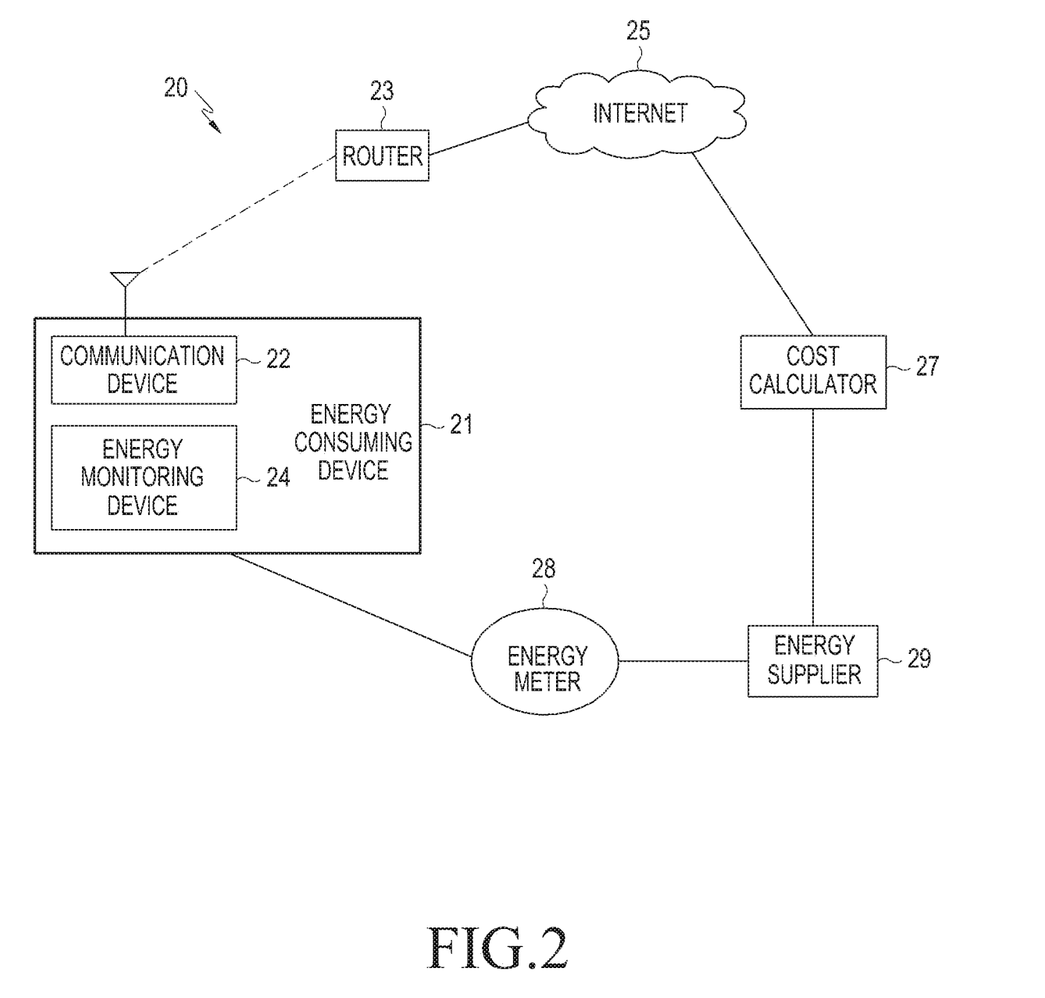
FIG. 2 is a schematic diagram of an energy system, according to an embodiment of the present disclosure.

FIG. 2 is a schematic diagram of an energy system, according to an embodiment of the present disclosure.

Referring to FIG. 2, an energy system according to an example embodiment and indicated generally by the reference numeral 20. The energy system 20 may include an energy consuming device 21 and an energy meter 28 for measuring the consumption of energy by the energy consuming device 21.

The energy consuming device 21 may refer to a device that may consume energy. For example, the energy may be electrical energy or energy obtained from a gas or water source. In embodiments of the present disclosure, the energy consumption device 21 may not limitedly use any particular energy source. The energy consuming device 21 may include a communication device 22 adapted to transmit information regarding the energy consuming device 21 to a cost calculator 27. The communication device 22 may transmit the information regarding the device to the cost calculator 27 through wired and/or wireless connection. In other embodiments, the communication device 22 may use Bluetooth to communicate with the cost calculator 27 wirelessly. The energy consuming device 21 is remote from the cost calculator 27. In the embodiment shown in FIG. 2, the energy consuming device 21 is an Internet-enabled device 21 that is able to transmit information to the cost calculator 27 over the Internet 25 via router 23. In other embodiments, the energy consuming device 21 may directly transmit information to the cost calculator 27. In other embodiments, the energy consuming device 21 may transmit information to the cost calculator 27 via a server.

The cost calculator 27 refers to any device to calculate a first charging rate of the energy consuming device 21 based on the information regarding the energy consuming device 21 received by the cost calculator 27. The cost calculator 27 may be associated with or incorporated in a smart meter. The cost calculator 27 may use the first charging rate to set up a charging rate for charging the user for the energy consumption of the energy consuming device 21. The cost calculator 27 may suggest or recommend other entity, such as an energy supplier for charging rate for the energy consumption of the energy consuming device 21. The cost calculator 27 may use information regarding the device 21 to calculate the first charging rate for the device 21. The first charging rate may define a cost for energy consumed by the energy consuming device 21. The information regarding the device 21 may include one or more of a type of the energy consuming device 21, a usage of the device 21, and a time of use of the device 21. The first charging rate may define a cost for energy consumed by the energy consuming device 21 based on the one or more of a type of the energy consuming device 21, a usage of the device 21, and a time of use of the device 21. The first charging rate may be calculated based on any or all of a type of the energy consuming device 21, a usage of the device 21, and a time of use of the device 21. In this way, using different rates for energy consuming devices, energy consumption of a particular energy consuming device may be rewarded or discouraged. Accordingly, the first charging rate for energy consumed by the device 21 may be calculated based on the information transmitted by the device 21 to the cost calculator 27. The first charging rate is specific to the device 21. In the related art arrangements, the energy consumption is either calculated for the whole premises or for two separate circuits, one of which has a cheaper rate. However, using two separate circuits is expensive and impractical in many situations. The related art arrangement will require a specific wiring configuration in the premises and an uncommon type of energy meter, and therefore is expensive to retrofit. Further, an energy consumer could plug other devices into the cheaper circuit of the twin rate meter 13 that the energy supplier did not intend to be entitled to the cheaper charging rate. Embodiments of the present disclosure may avoid this by calculating the charging rate based on the information transmitted by the device 21. Therefore, the cheaper charging rate may be given to a correct device and for a correct type of use. A cost calculated for the energy consumed by the energy consuming device 21 may not be about the whole premises but may be specific to a particular device, e.g., the energy consuming device 21. Depending on the information regarding the energy consuming device 21, the first charging rate may be lower than a charging rate given according to a charging rate used by a utility meter of the premise. In this way, usage of the energy consuming device 21 may be encouraged in a certain situation.

The first charging rate may define a cost per a unit for energy consumed by the energy consuming device 21. If the energy is electrical energy, the first charging rate may define a cost per kilowatt hour (kWh) for energy consumed by the energy consuming device 21. The cost may be 0 or negative, in which case the user may be reimbursed. The first charging rate may define a cost per operation performed by the energy consuming device 21. For example, it may be a cost for a cycle run by the washing machine.

The information regarding the device 21 may be securely transmitted and verified to add a layer of security. Encryption protocols and other known methods of data security may be implemented to help ensure that cheaper electricity rates are given to the correct devices.

The information regarding the type of the device 21 may include one or more of a category of the device 21, a manufacturer of the device 21, and a rating of the device 21 such as an energy rating of the device 21.

In one embodiment, different categories of devices have different charging rates such that certain categories of devices will cost a higher unit price for energy consumed than other devices. This means that the cost calculator 27 is able to reward energy consumption form certain categories of devices while discouraging the energy consumption of other categories of devices. In other words, the cost calculator 27 can calculate charging rates which incentivize higher/lower energy consumption. For example, electric vehicles may have a lower calculated charging rate for energy consumption in order to encourage or reward the use of electric vehicles. Transmitting information identifying the device 21 as an electric vehicle to the cost calculator 27 may avoid the situation outlined above for existing twin-rate energy meters where an energy consumer could plug other devices into a cheaper circuit intended for charging electric vehicles. Further, embodiments of the present disclosure avoid the need to rewire the premises and add an uncommon type of energy meter, which would be expensive and time intensive to retrofit.

In another embodiment, different manufacturers of devices have different charging rates such that devices manufactured by certain companies will cost a higher unit price for energy consumed than those manufactured by other companies. For example, if the information regarding the device 21 transmitted by the communication device 22 indicates that the manufacturer of the device 21 is company A, the cost calculator 27 will calculate the first charging rate to be less than a charging rate for energy consumed by a device manufactured by a company B. The manufacturer of the device 21 may have an association agreement with the energy supplier, and the cost calculator 27 may use this association information to calculate the first charging rate.

In another embodiment, different energy ratings of devices have different charging rates such that devices with certain energy ratings will cost a higher unit price for energy consumption than those of other devices with different energy ratings. For example, assume that the information regarding the device 21 transmitted by the communication device 22 indicates that the energy rating of the device 21 is A++ (an indication that the device is energy efficient). The cost calculator 27 may receive the information regarding the device 21 and calculate a first charging rate for energy consumed by the device 21 with the energy rating A++. The first charging rate is less than a charging rate for energy consumed by a device with a less-efficient energy rating. The cost calculator 27 may also be adapted to verify that the device 21 is consuming energy as defined by the transmitted energy rating. This may be, for example, to ensure that the device has not been reprogrammed to use energy less efficiently.

The information regarding the usage of the device 21 may include one or more of information regarding a previous usage of the device 21, information regarding a current usage of the device 21, and information regarding a scheduled future usage of the device 21.

In one embodiment, different previous usages of the device 21 may have different charging rates. This may be, for example, to reward previous economic or energy-efficient usage of the device 21 with future charging rates calculated at a lower rate. For example, if the device 21 is an electric vehicle 21, it may transmit driving data regarding how the vehicle 21 was driven since the last charge. If the driving data indicates that the vehicle 21 was driven in a safe or energy efficient way, the cost calculator 27 may calculate a first charging rate with per unit energy cost which is lower than if the electric vehicle 21 was driven in a less efficient manner. This will incentivize more efficient and safer driving.

In another embodiment, different current usages of the device 21 may have different charging rates. In this way, different energy prices will be calculated based on the way in which a device 21 is used. For example, if the device 21 is a washing machine 21, the communication device 22 of the washing machine 21 may transmit information regarding the type of cycle that is being run by the washing machine 21. The cost calculator 27 may calculate a lower charging rate for a low temperature cycle run by the washing machine 21 than, for example, a less-efficient mode of operation such as a super-speed wash. This will incentivize more efficient usage of the washing machine 21. Or for example, if the wholesale electricity price is negative during a windy hour, the cost calculator 27 may set a negative charging rate for a higher temperature wash to encourage higher energy use.

In another embodiment, different scheduled future usages of the device 21 will have different charging rates. This may be because the wholesale charging rate for electricity consumption varies and/or may be because, due to an association agreement between the device 21 manufacturer and the energy supplier, use of the device 21 at certain times of the day will be discounted, free, or even at a negative charging rate. In this way, the cost calculator 27 may schedule the future usage of the device 21 at a time for which the cost of energy is optimal. In particular, the cost calculator 27 may use the wholesale charging rate, any other costs associated with the supply of the energy, and the information regarding the device 21 to calculate the charging rate for the device 21 for different times of the day. Using this information, the cost calculator 27 may operate to find the cheapest cost of running the device 21 when scheduled for a later time/date based on the calculated charging rates and information regarding the historical energy usage of the device 21. For example, if the device 21 is a washing machine 21, the user may schedule their washing to be completed by 9:00 AM in the following morning. The cost calculator 27 may estimate the best time to run the washing cycle and how to run the washing cycle based on the type of cycle selected, the time for the cycle to complete, the energy used for the cycle and the different charging rates. The cost calculator 27 will calculate scheduling information for the washing machine 21 to help guarantee the completion of scheduled job in the best rate possible.

One or more of the above embodiments may be combined together to calculate the first charging rate. For example, the cost for energy consumption by the device 21 made by a certain manufacturer which has an association agreement with an energy supplier may be reduced, free or negative such that the consumer may be reimbursed if the device 21 is used at certain times of the day as set by the energy supplier. In addition, the charging rate may be further reduced if the device 21 is operated in an energy-efficient mode.

The cost calculator 27 may use the first charging rate to calculate the cost of the energy consumed by the energy consuming device 21. In particular, the cost calculator 27 may calculate the cost of energy consumed by the device 21 using information indicative of the energy consumed by the device 21 and the first charging rate. The information indicative of the energy consumed by the device may be information from which the power consumption of the device may be estimated or derived by the cost calculator 27. The communication device 22 of the device 21 may transmit the information indicative of the energy consumption to the cost calculator 27.

In one embodiment, the information indicative of the energy consumed by the device 21 may be information regarding the usage of the device 21 and/or the duration for which one or more components of the device 21 is used. In one example, the cost calculator 27 may have information regarding the power consumption of the one or more components of the device 21. This information regarding the power consumption may be transmitted to the cost calculator 27 from the communication device 22 of the device 21 either previously or at the time of transmitting the duration and/or usage information. For example, in a case that the device 21 is a washing machine 21, the information may include a power rating of a heating element in the washing machine 21 (e.g., 2000 W). This power rating may be held as a constant value in the cost calculator 27 so that the washing machine 21 has only to transmit the on/off time of the heating element to give the duration with which the heating element was on. Then these are combined using the formula, power×time, to calculate the electricity consumption and the bill based on the first charging rate calculated by the cost calculator 27. Similar calculations may be performed for the other components of the washing machine 21 such as the motor and water pump. In another example, the information regarding the power consumption as received by the cost calculator 27 may relate to an average power consumption of the one or more components of the device 21. The cost calculator 27 may use this information with the information regarding the usage of the device 21 and/or the duration from which the one or more components of the device 21 were used to calculate the energy consumption. If the device 21 is a washing machine, this information indicative of the energy consumption of the washing machine 21 may include information regarding the average usage of different cycles of the washing machine 21. Device testing performed by the manufacturer or other body may reveal that the wash stage of a washing cycle uses an average of 60 W power. This value may be held in the cost calculator 27. The washing machine 21 may then send information about the start and end of the washing phase along with other information on other variables which may be used to adjust the estimation. The time of the washing stage is multiplied by the average power value so that the energy consumption of the wash phase may be calculated.

In another embodiment, the information indicative of the energy consumed by the device 21 may be information regarding the usage of the device 21 and/or the duration for which one or more components of the device 21 is used. This information may be transmitted by the communication device 22 of the device 21 to the cost calculator 27. Further, the energy consumed by a grid or premises within which the device 21 is connected is received by the cost calculator 27. The energy consumed may be measured by the energy meter 28. In FIG. 2, the information regarding the energy consumption may be transmitted to the cost calculator 27 via the energy supplier 29. In other embodiments, the energy meter 28 may directly transmit information regarding energy consumption to the cost calculator 27. The cost calculator 27 may estimate the energy consumption of the device 21 based on the information regarding the energy consumed by the premises and the information indicative of the energy consumed by the device 21. In particular, the cost calculator 27 may combine the information received from the device 21 regarding the time and usage of the device 21 with the information regarding the energy consumption of the grid or premises to isolate the consumption of the device 21. The cost calculator 27 may use assisted disaggregation methods to isolate the consumption of the device 21 from the total energy consumption of the premises.

In another embodiment, the information indicative of the energy consumed by the device 21 may be the measured or estimated amount of energy consumed by the device 21. The communication device 22 of the device 21 may transmit the measured or estimated amount of energy consumed by the device 21 to the cost calculator 27. Referring to FIG. 2, the device 21 may include an energy monitoring device 24 for measuring the energy consumed by the device 21. The energy monitoring device 24 may be integrated into the device 21. In other arrangements, the energy monitoring device 24 may be separate from the device 21, for example by being implemented in a plug or power adapter for the device 21 from which the device 21 receives power from the mains circuit. In this way, the cost calculator 27 may not need to isolate the energy consumption of the device 21 from the total energy consumption of the premises.

The cost calculator 27 may use the calculated cost of energy consumed by the device 21 to charge or bill the user for the energy consumption. In one example embodiment, the device 21 may be associated with a billing account. The cost calculator 27 may identify the billing account of the device 21 based on the information regarding the device 21 and modify the billing account based on the first charging rate and/or the calculated cost of energy consumption by the device 21. The cost calculator 27 may directly charge the user's billing account. In FIG. 2, the user may be charged indirectly via the user's energy supplier 29. In particular, the cost calculator 27 may transmit information regarding the total amount of energy consumed by the device 21 and the different times at which the device 21 was used, and/or the calculated charging rate(s) for the energy consumption, and/or the cost of energy consumed by the device 21 to the energy supplier 29 such that the billing account for the user is modified by the energy supplier 29. In other example embodiments, the billing account may be modified indirectly via a third party company separate from the energy supplier 29. In other example embodiments, the energy charge or discount (if applied as an adjustment to an energy bill) may be provided in the form of cash or in alternative incentive payments such as through vouchers or points in a reward system. In other example embodiments, a rebate may be applied to the billing account. The user may have been initially billed for energy consumption by the device 21 based on the energy supplier's standard charging rate rather than the reduced first charging rate as calculated by the cost calculator 27. The user will receive a rebate based on the difference between the energy supplier's charging rate and the first charging rate.

Although only one energy consuming device 21 is shown in FIG. 2, it will be appreciated that any number of energy consuming devices may be present in the network.

Figure 3:
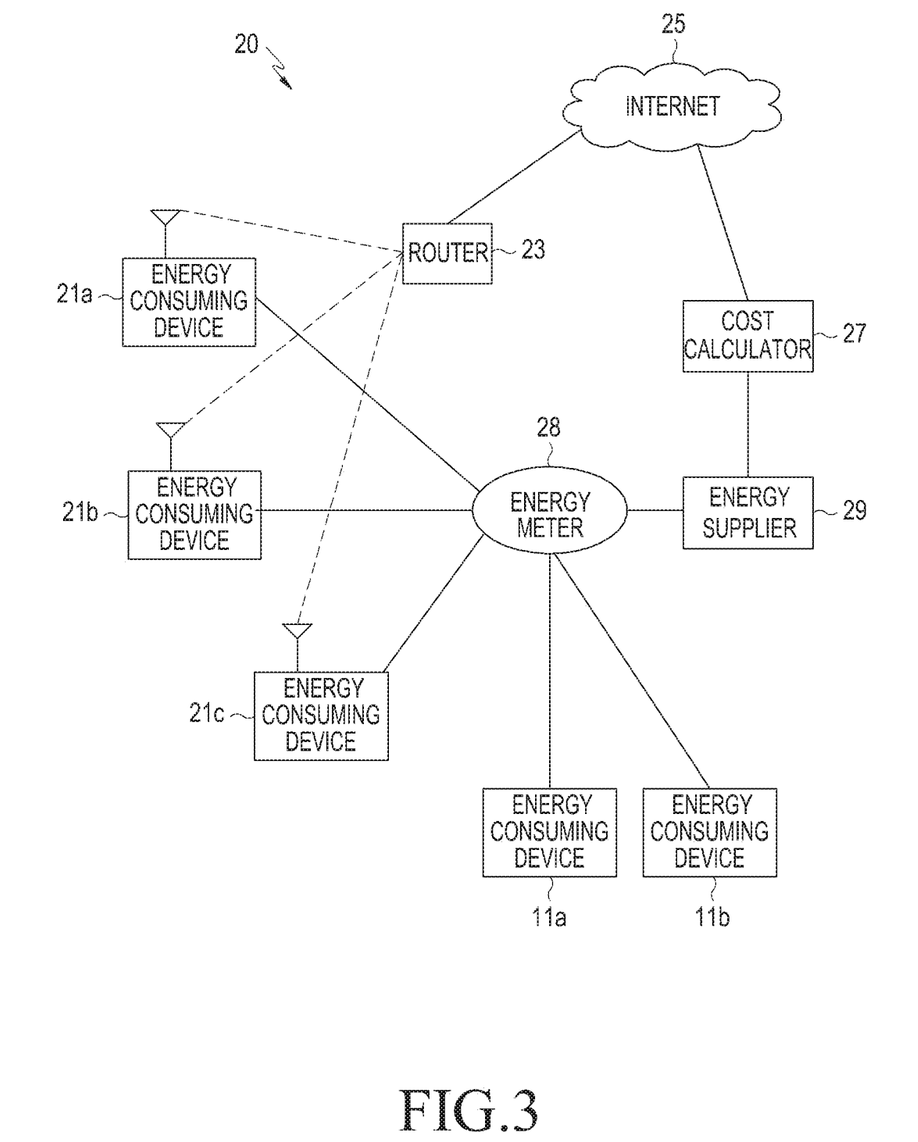
FIG. 3 is a schematic diagram of an energy system, according to an embodiment of the present disclosure.

FIG. 3 is a schematic diagram of an energy system, according to an embodiment of the present disclosure.

Referring to FIG. 3, an embodiment where there are a plurality of energy consuming devices 21a-21c. Each of the energy consuming devices 21a-21c may include a communication device for transmitting information regarding their respective devices 21a-21c. In this way, the cost calculator 27 is able to calculate a different charging rate for each energy consuming device 21a-21c based on the information transmitted by each energy consuming device 21a-21c. For example, the cost calculator 27 may calculate a first charging rate for the energy consuming device 21a, a second charging rate for the energy consuming device 21b, and a third charging rate for the energy consuming device 21c. In FIG. 3, a plurality of other energy consuming devices 11a-11b may also be provided. These devices 11a-11b do not transmit information regarding the devices 11a-11b to the cost calculator 27. Instead, the cost for energy consumed by these devices may be the general charging rate/tariff of the energy meter 28.

Figure 4:
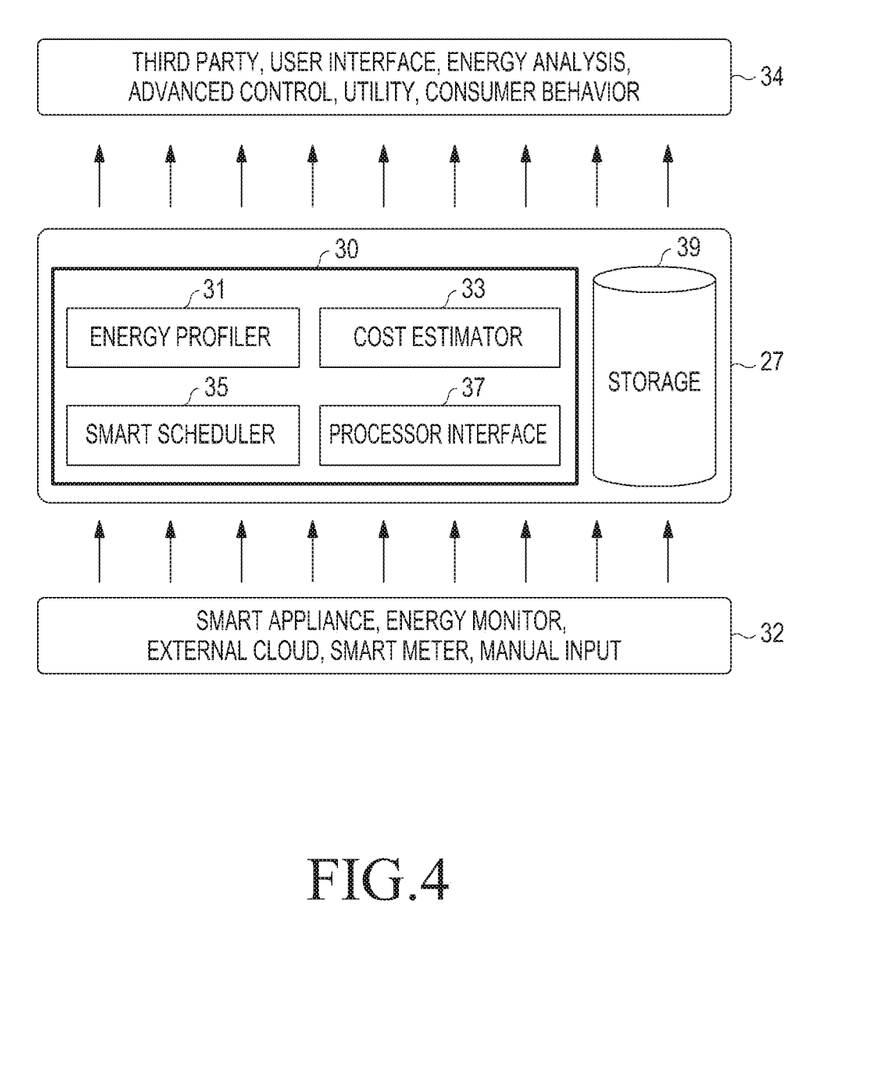
FIG. 4 is a schematic diagram of a cost calculator, according to an embodiment of the present disclosure.

FIG. 4 is a schematic diagram of a cost calculator, according to an embodiment of the present disclosure.

Referring to FIG. 4, an embodiment of the cost calculator 27. The cost calculator 27 may include a processor indicated generally by the reference numeral 30 for calculating the first charging rate for the device 21 based on the information regarding the device 21. The processor 30 may be in communication with a storage device 39 of the cost calculator 27. The cost calculator 27 is adapted to receive information from a number of devices/entities indicated generally by the reference numeral 32. The devices/entities 32 may include energy consuming devices, energy monitors, external clouds, smart meters and manual inputs from a user. The cost calculator 27 is adapted to transmit information to a number of devices/entities indicated generally by the reference numeral 34. These devices/entities 34 may include third parties, user interfaces, energy analytics, advanced controls, utilities, and consumer behavior trackers.

The processor 30 may have a number of modules for performing different functions. It will be appreciated that these modules need not necessarily be distinct units and instead may be integrated as a single unit in the processor 30. In addition, in some embodiments, one, some or all of these modules may be separate from the processor 30.

The processor 30 may include an energy profiler module 31. The energy profiler module 31 is adapted to generate an energy profile for the device 21 based on received information regarding the usage and energy consumption of the device 21. The energy profiler module 31 is further adapted to generate an energy map for the device 21 under varying circumstances and modes of operation. The energy profile may indicate the energy consumption of the device 21 over time. In particular, the energy profiler module 31 may use methods such as statistical comparison and disaggregation in combination with information regarding the usage and times of usage of the device 21 to calculate the energy consumption of the device 21 over time. The energy profiler module 31 is further adapted to generate an energy signature for the device 21 based on the usage and energy consumption of the device 21. The energy signature of the device 21 is a function of the energy usage and consumption of the device 21, and may be calculated in the following formula:

$$\text{appliance}_{uuid} = f(\text{energy usage, consumption pattern})$$

The energy signature of the device 21 may be unique to the manufacturer or category of the device 21. The energy signature may be used by the cost calculator 27 to identify the device 21 based on its manufacturer or its category. The energy signature may be combined with information from the device 21 about the type of device 21, the usage of the device 21 (e.g., cycle type) and manufacturer to verify this received information. This may be performed by comparing the energy signature received from the energy monitoring equipment in or associated with the device 21 with the expected energy signature for that type of device and/or type of use.

The cost calculator 27 is adapted to transmit the energy profile to a display apparatus (not shown) such that the energy profile may be displayed to the user. The energy profiler module may enable automatic labeling of the device 21 within the premises. The cost calculator 27 is further adapted to transmit the first charging rate to the display such that the charging rate(s) of the device may be indicated to the user.

Figure 5:
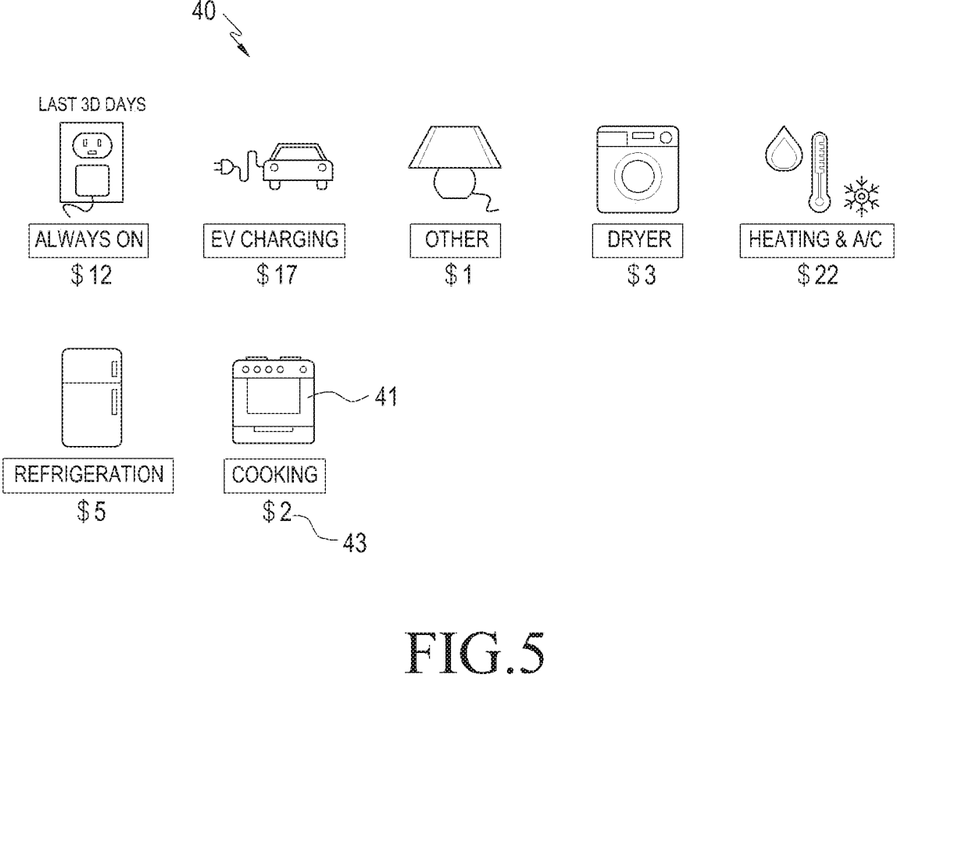
FIG. 5 is a schematic diagram of a display by a display device, according to an embodiment of the present disclosure.

FIG. 5 is a schematic diagram of a display by a display device, according to an embodiment of the present disclosure.

Referring to FIG. 5, an example display indicated generally by the reference numeral 40 on the display apparatus based on the energy profile information received from the cost calculator 27. The display apparatus may display icons 41 for each of the devices identified by the energy profiler module 31 as consuming energy. In addition, the display apparatus may display the running cost 43 of each device based on the calculated charging rate(s) and the period of operation of the device.

Referring back to FIG. 4, the processor 30 may include a cost estimator module 33. The cost estimator module 33 may use a running cost algorithm to calculate the cost for energy used by the device 21. The cost estimator module 33 may estimate a discount to the energy consumption of the device 21 during a period where the charging rate for energy consumption by the device 21 is discounted.

Figure 6:
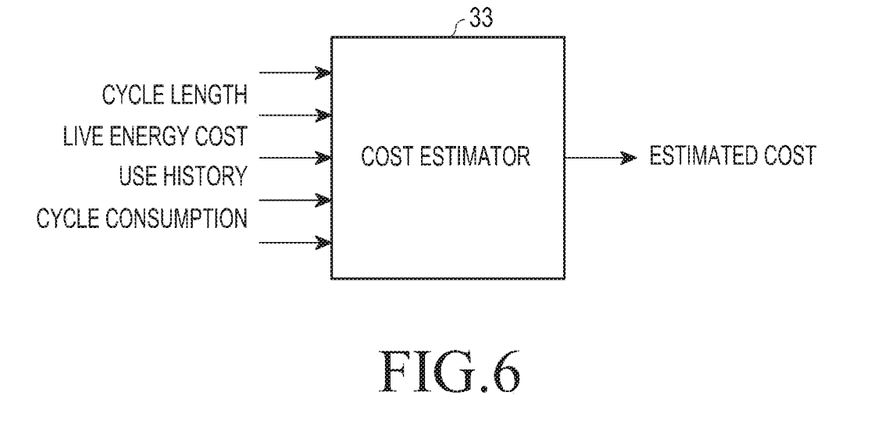
FIG. 6 is a schematic diagram of a cost estimator module of a cost calculator, according to an embodiment of the present disclosure.

FIG. 6 is a schematic diagram of a cost estimator module of a cost calculator, according to an embodiment of the present disclosure.

Referring to FIG. 6, there is shown an example embodiment of the cost estimator module 33 as used to estimate the cost of energy consumption where the device 21 is a washing machine 21. The cost estimator module 33 may receive, as inputs, the cycle length, the live energy charging rate, the usage history, and the cycle consumption of the device 21 and output a predicted cost for the energy consumed by the device 21. The cost calculator 27 is adapted to transmit information from the cost estimator 33 to the display apparatus such that the cost estimate information may be displayed to the user.

Figure 7:
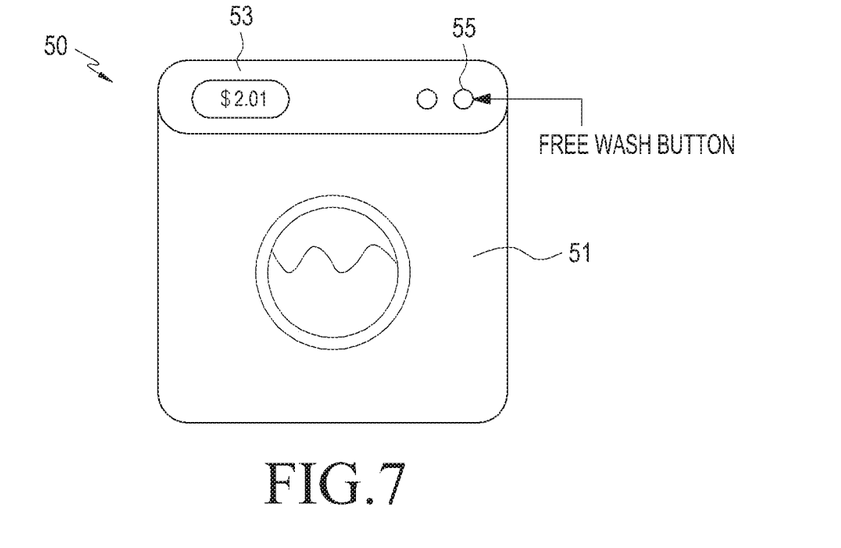
FIG. 7 is a schematic diagram of a display by a display device, according to an embodiment of the present disclosure.

FIG. 7 is a schematic diagram of a display by a display device, according to an embodiment of the present disclosure.

Referring to FIG. 7, an example display indicated generally by the reference numeral 50 on the display apparatus. The display apparatus may display an icon 51 for the device 21 along with information 53 regarding the running cost of the device 21. In this example, the device 21 is a washing machine 21. The display apparatus may further display a free wash button 55, which may enable the cost estimator to make the next operation of the device 21 free or at a lower cost using the cost prediction information calculated by the cost estimator module 33 and based on the wash type selected by the user.

The energy profiler module 31 and cost estimator module 33 may allow for accurate cost estimation and energy profiling of the device 21. For example, the user may set a budget for energy consumption each month for a device 21 or group of devices. The energy profiler module 31 and cost estimator module 33 may help optimize usage of the device 21 or group of devices 21 to keep the running costs under the user's budget. The energy profiler module 31 and cost estimator module 33 may further enable alerts and notifications to be displayed on the display apparatus to help the user meet their budget.

Referring to FIG. 4, the processor 30 may include a scheduling module 35. The scheduling module 35 is adapted to calculate scheduling information for controlling the operation of the device 21. The cost calculator 27 is adapted to transmit the scheduling information to the device 21. The scheduling module 35 may generate the scheduling information based on the information regarding the device 21. The scheduling module 35 is adapted to calculate the scheduling information based on the information regarding a scheduled future usage of the device 21. The scheduling information may also enable the device 21 to work in an automatic mode based on the budget allocation for the device 21. In particular, the scheduling module 35 may automatically schedule the operation of the device 21 based on a fixed energy budget.

Figure 8:
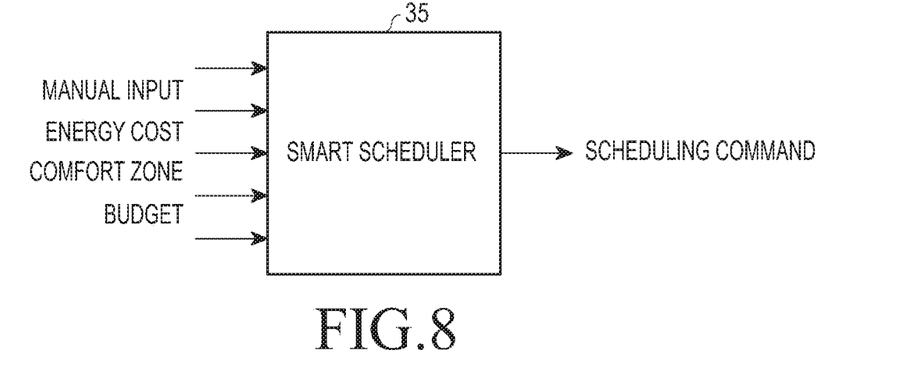
FIG. 8 is a schematic diagram of a scheduling module of a cost calculator, according to an embodiment of the present disclosure.

FIG. 8 is a schematic diagram of a scheduling module of a cost calculator, according to an embodiment of the present disclosure.

Referring to FIG. 8, an example embodiment of the scheduling module 35. The scheduling module 35 may receive, as inputs, a manual input from a user, an energy price, a comfort zone of the user, and a budget of the user. The comfort zone of the user may include user requirements such as what time the washing should be finished, and how clean the clothes should be. The scheduling module 35 may use these inputs to generate a scheduling command for controlling the device 21. This scheduling module 35 may embed various communication protocols to enable smart scheduling and control of the device 21. The scheduling module 35 is also able to communicate with various other home automation protocols.

Referring to FIG. 4, there is shown a processor interface 37 for the cost calculator 27.

The use of embodiments of the present disclosure will now be described. In this example embodiment, the energy consuming device 21 is a washing machine 21.

The communication device 22 of the washing machine 21 may transmit information to the cost calculator 27 identifying that washing machine 21 belongs to the washing machine category of devices.

The communication device 22 of the washing machine 21 may transmit information to the cost calculator 27 identifying the manufacturer of the washing machine 21.

The communication device 22 of the washing machine 21 may transmit information to the cost calculator 27 identifying the energy rating of the washing machine 21.

The communication device 22 of the washing machine 21 may transmit information to the cost calculator 27 identifying the billing account associated with the washing machine 21. In other embodiments, the billing account information may be held in the cloud and the cost calculator 27 may match the washing machine identifying information and the billing account.

The communication device 22 of the washing machine 21 may transmit information to the cost calculator 27 regarding the times of day at which the washing machine 21 was used and the type of usage. The information may include the start time of the washing machine operations and the type of washing operations that were performed.

The cost calculator 27 may receive the information from the washing machine 21 and further receive information from the energy meter 28 regarding the energy consumed by the premises in which the washing machine 21 is located.

The cost calculator 27 may calculate the energy consumed by the washing machine 21 by isolating the energy consumed by the washing machine from the energy consumption of the premises as measured by the energy meter 28. The cost calculator 27 may do this by using assisted disaggregation methods which use the total energy consumption of the premises and the information regarding the times at which the device 21 was used and the type of usage of the device 21.

The cost calculator 27 may calculate a first charging rate for the washing machine 21 based on the received information regarding the category, manufacturer, energy rating, usage and time of usage of the device 21.

The cost calculator 27 may combine the energy consumption information of the washing machine 21 with the first charging rate to calculate a cost for energy consumed by the washing machine 21. The cost calculator 27 may charge the user directly for the washing machine, or indirectly via the user's energy supplier 29 (e.g., applied as an adjustment to the energy bill) or via a third party company.

The use of embodiments of the present disclosure will now be described. In this example embodiment, the energy consuming device 21 is a washing machine 21.

The communication device 22 of the washing machine 21 may transmit information to the cost calculator 27 identifying that washing machine 21 belongs to the washing machine category of devices.

The communication device 22 of the washing machine 21 may transmit information to the cost calculator 27 identifying the manufacturer of the washing machine 21.

The communication device 22 of the washing machine 21 may transmit information to the cost calculator 27 identifying the energy efficiency rating of the washing machine 21.

The communication device 22 of the washing machine 21 may transmit information to the cost calculator 27 identifying the billing account associated with the washing machine 21. In other embodiments, the billing account information may be held in the cloud and the cost calculator 27 may match the washing machine identifying information and the billing account.

The communication device 22 of the washing machine 21 may transmit information to the cost calculator 27 regarding the times of day at which the washing machine 21 was used and the type of usage. The information may include the start time of the washing machine operations and the type of washing operations that were performed.

The washing machine 21 may have an energy monitoring device 24 built-in/integrated into to the washing machine. The communication device 22 of the washing machine 21 may transmit information to the cost calculator 27 regarding the energy consumption of washing machine 21.

The cost calculator 27 may calculate a first charging rate for the washing machine 21 based on the received information regarding the category, manufacturer, energy rating, usage and time of usage of the device 21.

The cost calculator 27 may combine the energy consumption information of the washing machine 21 with the first charging rate to calculate a cost for energy consumed by the washing machine 21. The cost calculator 27 may charge the user directly or indirectly via the user's energy supplier 29 (e.g., applied as an adjustment to the energy bill) or via a third party company.

In the above embodiments, the cost calculator 27 was shown as a separate unit, but embodiments of the present disclosure are not limited to this specific arrangement. For example, in other embodiments, the cost calculator 27 may be part of the energy supplier 29 or the energy meter 28.

Figure 9:
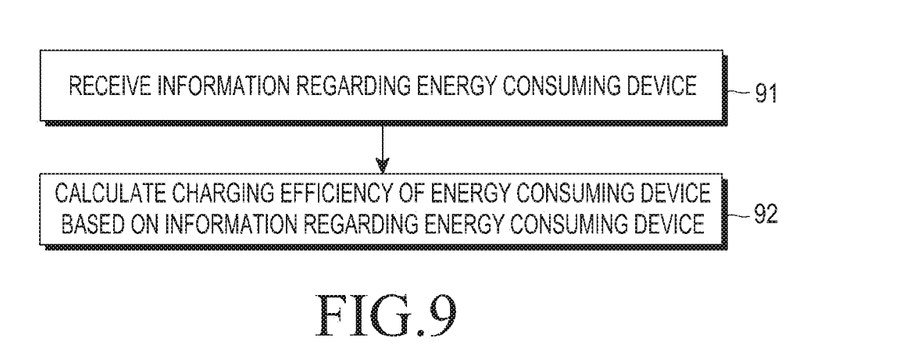
FIG. 9 is a flowchart illustrating operation of a cost calculator, according to an embodiment of the present disclosure.

FIG. 9 is a flowchart illustrating operation of a cost calculator, according to an embodiment of the present disclosure.

Referring to FIG. 9, a flowchart illustrating operation of a cost calculator, according to an embodiment of the present disclosure. At operation 91, the cost calculator 27 receives information regarding the energy consuming device 21 from the energy consuming device 21. At operation 92, the cost calculator 27 calculates a charging rate for the energy consuming device 21 based on the information regarding the energy consuming device 21 received at operation 91.

At this point it should be noted that various embodiments of the present disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various embodiments of the present disclosure as described above. Alternatively, one or more processors operating in accordance with stored instructions may implement the functions associated with the various embodiments of the present disclosure as described above. If such is the case, it is within the scope of the present disclosure that such instructions may be stored on one or more non-transitory processor readable mediums. Examples of the processor readable mediums include read-only memory (ROM), random-access memory (RAM), CD-ROMs, magnetic tapes, floppy disks, and optical data storage devices. The processor readable mediums can also be distributed over network coupled computer systems so that the instructions are stored and executed in a distributed fashion. Also, functional computer programs, instructions, and instruction segments for accomplishing the present disclosure can be easily construed by programmers skilled in the art to which the present disclosure pertains.

The present disclosure has at least the advantages described herein.

An apparatus and method may be provided to reduce the burden on rising costs and determine charging rates for energy consumption of individual devices.

Furthermore, an apparatus and method may be provided to encourage or discourage energy consumption of a particular device at particular times.

Moreover, an apparatus and method may be provided to encourage or discourage energy consumption of a particular type of device.

In addition, an apparatus and method may be provided to schedule operations of an energy consumption device by taking into account energy costs, user comfort zones, user's budget, etc.

The advantageous effects of the present disclosure are not limited to what are described above, but more various effects may be included in the specification.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for calculating a cost for energy consumption, the method comprising:
   receiving, by at least one processor, first and second information regarding first and second energy consuming devices from the first and second energy consuming devices, respectively, wherein each of the first and second information regarding the first and second energy consuming devices comprises information regarding at least one of a type of each energy consuming device, a usage of each energy consuming device, or times of use of each energy consuming device;
   determining, by the at least one processor, a first charging rate for energy consumed by the first energy consuming device based on the received first information regarding the first energy consuming device, wherein the first charging rate indicates a cost per unit amount of energy consumed by the first energy consuming device;
   determining, by the at least one processor, a second charging rate for energy consumed by the second energy consuming device based on the received second information regarding the second energy consuming device, wherein the second charging rate indicates a cost per unit amount of energy consumed by the second energy consuming device, wherein the first and second charging rates for a same time period are different from each other;

setting, by the at least one processor, the determined first and second charging rates as charging rates for the first and second energy consuming devices; and scheduling, by the at least one processor, a command for controlling each of the first and second energy consuming devices including scheduling information based on the usage of each energy consuming device.

2. The method of claim 1, wherein the information regarding the usage of each energy consuming device comprises at least one of a previous usage of each energy consuming device, a current usage of each energy consuming device, or a scheduled future usage of each energy consuming device.

3. The method of claim 1, wherein the information regarding the type of each energy consuming device comprises at least one of a category of each energy consuming device, a manufacturer of each energy consuming device, or a rating of each energy consuming device.

4. The method of claim 1, wherein each of the first and second charging rates is further determined based on information regarding an association between an energy supplier for each energy consuming device and a manufacturer of each energy consuming device.

5. The method of claim 1, further comprising:
obtaining, by the at least one processor, information indicating an amount of energy consumed by the first energy consuming device from one of the first energy consuming device or an energy meter; and
identifying, by the at least one processor, a cost for the amount of energy consumed by the first energy consuming device based on the amount of energy consumed by the first energy consuming device and the first charging rate.

6. The method of claim 5, wherein the information indicating the amount of energy consumed by the first energy consuming device comprises information indicating amounts of energy consumed by the first energy consuming device at different times.

7. The method of claim 1, further comprising:
transmitting the command to each of the first and second energy consuming devices.

8. An apparatus for calculating a cost for energy consumption, the apparatus comprising:
a transceiver; and
at least one processor coupled to the transceiver,
wherein the at least one processor is configured to:
receive first and second information regarding first and second energy consuming devices from the first and second energy consuming devices, respectively, wherein each of the first and second information regarding the first and second energy consuming devices comprises information regarding at least one of a type of each energy consuming device, a usage of each energy consuming device, or times of use of each energy consuming device,
determine a first charging rate for energy consumed by the first energy consuming device based on the received first information regarding the first energy consuming device, wherein the first charging rate indicates a cost per unit amount of energy consumed by the first energy consuming device,
determine a second charging rate for energy consumed by the second energy consuming device based on the received second information regarding the second energy consuming device, wherein the second charging rate indicates a cost per unit amount of energy consumed by the second energy consuming device, wherein the first and second charging rates for a same time period are different from each other,
set the determined first and second charging rates as charging rates for the first and second energy consuming devices, and
schedule a command for controlling each of the first and second energy consuming devices including scheduling information based on the usage of each energy consuming device.

9. The apparatus of claim 8, wherein the information regarding the usage of each energy consuming device comprises at least one of a previous usage of each energy consuming device, a current usage of each energy consuming device, or a scheduled future usage of each energy consuming device.

10. The apparatus of claim 8, wherein the information regarding the type of each energy consuming device comprises at least one of a category of each energy consuming device, a manufacturer of each energy consuming device, or a rating of each energy consuming device.

11. The apparatus of claim 8, wherein each of the first and second charging rates is further determined based on information regarding an association between an energy supplier for each energy consuming device and a manufacturer of each energy consuming device.

12. The apparatus of claim 8, wherein the at least one processor is further configured to:
obtain information indicating an amount of energy consumed by the first energy consuming device from one of the first energy consuming device or an energy meter, and
identify a cost for the amount of energy consumed by the first energy consuming device based on the amount of energy consumed by the first energy consuming device and the first charging rate.

13. The apparatus of claim 12, wherein the information indicating the amount of energy consumed by the first energy consuming device comprises information indicating amounts of energy consumed by the first energy consuming device at different times.

14. The apparatus of claim 8, wherein the at least one processor is further configured to:
transmit the command to each of the first and second energy consuming devices.

15. An energy consuming device comprising:
a transceiver; and
at least one processor coupled to the transceiver,
wherein the at least one processor is configured to:
transmit, via the transceiver, information regarding the energy consuming device to an energy consumption cost calculator,
wherein the information regarding the energy consuming device comprises information regarding at least one of a type of the energy consuming device, a usage of the energy consuming device, or times of use of the energy consuming device, and
receive, via the transceiver, a command for controlling the energy consuming device including scheduling information based on the usage of the energy consuming device.

* * * * *